(12) United States Patent
Matsunaga et al.

(10) Patent No.: US 8,304,091 B2
(45) Date of Patent: Nov. 6, 2012

(54) ELECTRODEPOSITED COPPER FOIL WITH CARRIER FOIL WITH A PRIMER RESIN LAYER AND MANUFACTURING METHOD THEREOF

(75) Inventors: Tetsuhiro Matsunaga, Ageo (JP); Toshifumi Matsushima, Ageo (JP); Tetsuro Sato, Ageo (JP); Kensuke Nakamura, Ageo (JP); Hiroyuki Kon, Ageo (JP); Kenichiro Iwakiri, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 1185 days.

(21) Appl. No.: 11/662,475

(22) PCT Filed: Sep. 9, 2005

(86) PCT No.: PCT/JP2005/016609
§ 371 (c)(1),
(2), (4) Date: Jul. 12, 2007

(87) PCT Pub. No.: WO2006/028207
PCT Pub. Date: Mar. 16, 2006

(65) Prior Publication Data
US 2008/0107865 A1    May 8, 2008

(30) Foreign Application Priority Data

Sep. 10, 2004  (JP) .................................. 2004-264640

(51) Int. Cl.
*B32B 15/092*  (2006.01)
*C25D 5/34*  (2006.01)

(52) U.S. Cl. ....................................... 428/626; 205/205

(58) Field of Classification Search .................. None
See application file for complete search history.

(56) References Cited

U.S. PATENT DOCUMENTS

| 6,984,456 B2 * | 1/2006 | Okada et al. ................... 428/621 |
| 2003/0224177 A1 * | 12/2003 | Furuta et al. ................... 428/413 |
| 2004/0161593 A1 | 8/2004 | Yamazaki et al. |
| 2004/0188263 A1 * | 9/2004 | Sugimoto et al. ............. 205/111 |

FOREIGN PATENT DOCUMENTS

| JP | 11-340595 A | 12/1999 |
| JP | 2000-309898 A | 11/2000 |
| JP | 2004249480 A * | 9/2004 |
| JP | 2005-262506 A | 9/2005 |
| WO | WO 03088725 A1 * | 10/2003 |
| WO | WO 03/096775 A1 | 11/2003 |
| WO | WO 03096776 A1 * | 11/2003 |

OTHER PUBLICATIONS

English Translation of JP 2004-249480, Printed Sep. 29, 2010.*

* cited by examiner

*Primary Examiner* — Jennifer McNeil
*Assistant Examiner* — Adam Krupicka
(74) *Attorney, Agent, or Firm* — Greenblum & Bernstein, P.L.C.

(57) ABSTRACT

Present invention provides an electrodeposited copper foil with carrier foil that assure high bonding strength between a surface of the bulk copper layer and a resin substrate layer even when surface roughness is low, and hardly occurs delamination even when pin holes and the like remain in a bulk copper layer or in the side wall of the through holes or via holes and the like after contact with a desmear solution and the like. To solve such a problem, electrodeposited copper foil with carrier foil with a primer resin layer comprising a bonding interface layer, a bulk copper layer, a plated Ni—Zn alloy layer and a primer resin layer which is formed in this order at least on one surface of the carrier foil is applied.

20 Claims, No Drawings

ELECTRODEPOSITED COPPER FOIL WITH CARRIER FOIL WITH A PRIMER RESIN LAYER AND MANUFACTURING METHOD THEREOF

CROSS REFERENCE TO RELATED APPLICATION

This application is a 35 USC §371 National Phase Entry Application from PCT/JP2005/016609, filed Sep. 9, 2005, and designating the United States.

TECHNICAL FIELD

The present invention relates to electrodeposited copper foil with carrier foil with a primer resin layer and manufacturing method thereof.

BACKGROUND ART

Electrodeposited copper foil with carrier foil is being used in fields of electric industries or electronic industries as raw materials for manufacturing of printed wiring board and the like. Applying of the electrodeposited copper foil with carrier foil has begun as a result of requirements for thinning and fining pitch of the printed wiring boards and the like. It consists of a carrier foil and a thin copper foil (hereinafter also to be referred to as "bulk copper layer"), which is formed by electrolytic deposition on a surface of the carrier foil via a bonding interface layer and the like to have required thickness of around several μm, such as 3 μm or 5 μm, for example. The carrier foil, which is a foil usually having a thickness of around 18 μm to 35 μm, is used for reinforcing a thin bulk copper layer with low mechanical strength due to its thickness of around several μm. As carrier foil, for example, copper foil is mainly used. The copper foil for use as carrier foil has thicker and tougher mechanical strength than the copper foil employed as a bulk copper layer.

Here, on the surface side of the bulk copper layer in the electrodeposited copper foil with carrier foil which does not face the carrier foil, that is a surface side of direction for thickness increasing of the bulk copper layer by electrolytic deposition (hereinafter also to be referred to as "the deposition side surface of bulk copper layer"), various kinds of treatments are usually carried out: such as a roughening treatment, e.g., a nodular treatment and the like of the surface of the copper layer, an inorganic treatment, such as plating with a metal element, or an organic treatment of applying a silane coupling agent and the like in consideration of a bonding ability or a shelf life. In the present specification, a bulk copper layer that has been subjected to the above described roughening treatment will be also called a "bulk copper layer", while the layer formed during an inorganic rust proofing treatment is also called an "inorganic treated layer". In addition, in the present specification, the surface of the inorganic treated layer formed on the bulk copper layer is also called an "inorganic treated layer surface".

In case of manufacturing a printed wiring board with the above described electrodeposited copper foil with carrier foil, the bulk copper layer portion is usually used as a circuit forming material, and therefore a printed wiring board is manufactured generally along steps as follows. That is, at first, an inorganic treated layer surface formed on the deposition side surface of the bulk copper layer or, as required, a silane coupling agent layer formed on the surface of a bulk copper layer are brought into contact with the pre-preg (FR-4 substrate and the like), and they are bonded together by hot pressing, and thus the resin substrate layer has been hardened to obtain a copper-clad laminate with a carrier foil. Here, for the purpose of simplifying the description, further details with regard to the inorganic treated layer and the silane coupling agent layer will be omitted.

Next, the carrier foil is released from the copper-clad laminate to obtain a copper-clad laminate consisting of the bulk copper layer and the resin substrate layer. Next, after the bulk copper layer surface of the copper-clad laminate is subjected to acid cleaning with diluted acid, and the bulk copper layer is etched with an etching solution such as copper chloride solution and the like to obtain a circuit. Here, in the above described step, by hot pressing one sheet of electrodeposited copper foil with carrier foil with a resin impregnated base material, derives a single-sided printed wiring board, while by employing two sheets of electrodeposited copper foil with carrier foil on both sides of a resin impregnated base materials, derives a double-sided printed wiring board.

A printed wiring board in recent years is often used as a multilayer printed wiring board with circuits in multiple layers. In this case, the following steps are usually carried out. That is, a plurality of double-sided printed wiring boards usually with respectively different circuit patterns are produced by the above described manner, and resin impregnated base materials are sandwiched between these double-sided printed wiring boards and undergo hot pressing to laminate to obtain a multilayer printed wiring board.

In the case of a double-sided printed wiring board or a multilayer printed wiring board, circuits that are sandwiched between one or more layers of resin substrate are electrically connected. To do so, "through holes" or "via holes" and the like as a penetrated hole or a blind hole are formed by laser drilling and the like. Then they are subjected to desmear processing with an alkaline potassium permanganate solution and the like to remove smears in the holes, followed by copper plating.

As a method of releasing carrier foil that is not useful in the step of manufacturing the above described single-sided printed wiring board or double-sided printed wiring board, a method of peeling along a bonding interface layer, that has been formed between the carrier foil and the bulk copper layer and which has a comparatively weak bonding strength, or a method of etching away the carrier foil is employed. A type of electrodeposited copper foil with carrier foil corresponding with the former method is called electrodeposited copper foil with carrier foil of a peelable type. While a type of electrodeposited copper foil with carrier foil corresponding with the latter method is called electrodeposited copper foil with carrier foil of an etchable type. Among them, since the latter has drawback in that it costs much for etching equipment and the like, in recent years, the peelable type of the electrodeposited copper foil with carrier foil has become in wide use.

Since the use of the above described electrodeposited copper foil with carrier foil enables to make the thickness of the bulk copper foil thin by securing the strength level by the carrier foil, thinning of printed wiring boards, enhancement in miniaturizing and light weight and fining of circuits and the like can be designated when compared with the case of using copper foil with conventional thickness. In particular, the electrodeposited copper foil with carrier foil of a peelable type has become preferable for use due to its easy releasing of the carrier foil and for its low cost.

However, in electrodeposited copper foil with carrier foil, a bulk copper layer is very thin with thickness of around 3 μm or 5 μm and the deposition side surface of bulk copper layer is smooth, and therefore bonding the deposition side surface of bulk copper layer, the surface of inorganic treated layer formed on the deposition side surface of bulk copper layer or a silane coupling agent layer formed as required and a resin substrate layer often shows too low bonding strength, and is hard to use in manufacturing a printed wiring board. Therefore, usually a roughening treatment by electrolyzing the electrodeposited copper foil with carrier foil in a copper electrolytic solution to form minute copper particles and the like on the deposition side surface of the bulk copper layer is carried out to increase the roughness, followed by a process of forming an inorganic treatment layer or a silane coupling agent layer. This allows to increase the bonding strength between the bulk copper layer and the resin substrate layer.

However, in recent years, decrease in roughness of a deposition side surface of bulk copper layer as much as possible is demanded in order to fulfill features such as a finer circuit, a migration resistance and a controlled impedance. However, when a roughening treatment is carried out leading to a decreased roughness, a problem arises that the bonding strength is hard to increase as required. Therefore, electrodeposited copper foil with carrier foil having high bonding strength has been required more and more, either without or with the roughening treatment described above providing lower roughness on the bulk copper layer.

In addition, the electrodeposited copper foil with carrier foil having a thickness of the bulk copper layer of 3 μm or more does not show a defect of pin holes and the like, since electrolytic deposition may fill pin holes and the like. But generally, in the case where the thickness of the bulk copper layer is less than 3 μm and very thin, and a roughening treatment is not carried out or is not carried out sufficiently, pin holes and the like are not filled successfully and the pin holes and the like may remain. Therefore, in any type of printed wiring board, such as single-sided printed wiring board, double-sided printed wiring board or multilayer printed wiring board, a problem arrives that an inorganic rust proofing layer usually present at the interface between the bulk copper layer and the resin substrate layer is corroded by an acid cleaning solution, an etching solution or a desmear solution inside the pin holes and the like at the time of production thereof, the interface may create delamination, and a circuit formed on the delaminated portion is easily peeled off. In particular, as described above, in electrodeposited copper foil with carrier foil of a type without a roughening treatment on the deposition side surface of the bulk copper layer or with a roughening treatment to provide low roughness, an interface between the bulk copper layer and the resin substrate layer is bonded with a surface in smooth or similar state, and therefore an acid cleaning solution, an etching solution or a desmear solution will easily spread over a wide area into the above described inorganic treated layer compared with a conventional type of electrodeposited copper foil with carrier foil that is carried out a roughening treatment to provide a comparatively high roughness onto the deposition side surface of bulk copper layer. Therefore, a problem that a circuit peels off easily will come out.

Moreover, in case of producing a double-sided printed wiring board or a multilayer printed wiring board with conventional electrodeposited copper foil with carrier foil, such a problem comes out that an inorganic treatment layer usually present on the interface between the bulk copper layer and the resin substrate layer exposed in the side wall of holes such as through holes or via holes and the like is corroded by a desmear solution at the time of a desmear process and may create delamination, and a circuit formed on the delaminated portion may peel off.

Due to the above described situations, an electrodeposited copper foil with carrier foil is required having a bonding strength high enough between the deposition side surface of a bulk copper layer or the surface of an inorganic treated layer and the resin substrate layer, even when roughness of the deposition side surface of the bulk copper layer or of the surface of the inorganic treated layer is low. Also, it is desired that the interface between the bulk copper layer and the resin substrate layer is hard to delaminate, even when contacted with an acid cleaning solution, an etching solution or a desmear solution where pin holes and the like remain in the bulk copper layer or the side wall in the holes of through holes or via holes and the like.

In contrast, a prior art related to electrodeposited copper foil with carrier foil of a peelable type, JP-A-2000-309898 (Patent Document 1), for example, discloses electrodeposited copper foil with carrier foil, comprising a bonding interface layer being formed on a surface of carrier foil with an organic agent, and with electrodeposited copper foil layer being deposited and formed on the bonding interface layer. It is discussed that by using such an electrodeposited copper foil with carrier foil, the stability is high in peeling during releasing the carrier foil and therefore a yield of production can be improved greatly.

[Patent Document 1]

Japanese Patent Laid-Open No. 2000-309898 (first column on Page 2)

DISCLOSURE OF THE INVENTION

Problems to be Solved by the Invention

However, the electrodeposited copper foil with carrier foil disclosed in the patent document 1 causes a problem that it is hard to have high enough bonding strength between the bulk copper layer and the resin substrate layer in the case where roughness of the deposition side surface of the bulk copper layer or the inorganic treated layer surface is low. In addition, the electrodeposited copper foil with carrier foil has caused a problem of delamination on the interface between the bulk copper layer and the resin substrate layer when contacted with acid cleaning solution, etching solution or desmear solution during producing a printed wiring board wherein pin holes and the like remain in the bulk copper layer, or in the case where the side wall of in holes, through holes or via holes and the like contacts with desmear solution during desmear processing and the like.

Accordingly, an object of the present invention is to provide electrodeposited copper foil with carrier foil which shows high bonding strength between the bulk copper layer and the resin substrate layer even when surface roughness of the deposition side surface of the bulk copper layer or the inorganic treated layer surface is low, and wherein it is hard to delaminate within the inorganic treated layer surface and the resin substrate layer, even when pin holes and the like remain in the bulk copper layer, or when the side wall of through holes or via holes and the like is contacted with the desmear solution and the like.

Means for Solving the Problems

Under such current situations, as a result of serious studies, the present inventors have found that the above described object can be attained with the present invention, in which electrodeposited copper foil with carrier foil comprises at least a plated Ni—Zn alloy layer and a primer resin layer in this order on the surface of a bulk copper layer with low surface roughness, wherein a roughness $R_{zjis}$ measured on the surface of the above described plated Ni—Zn alloy layer or a roughness measured on a chromate layer surface, in the case where a chromate layer has been further formed on the surface of the above described plated Ni—Zn alloy layer, falls within a specific range, and the above described plated Ni—Zn alloy layer contains Ni and Zn, and a Ni/Zn deposit amount ratio in the layer falls within a specific range.

The electrodeposited copper foil with carrier foil with primer resin layer of the present invention is characterized in the construction by comprising a bonding interface layer, a bulk copper layer, a rust proofing layer and a primer resin layer which are formed in this order on the surface of at least one side of the carrier foil, in which a plated Ni—Zn alloy layer constitute the rust proofing layer and a roughness $R_{zjis}$ measured on the surface of said plated Ni—Zn alloy layer is not more than 3 μm, and said plated Ni—Zn alloy layer contains Ni and Zn, and a Ni/Zn deposit amount ratio in the layer is 1.5 to 10.

The electrodeposited copper foil with carrier foil with primer resin layer of the present invention is preferred to comprise a silane coupling agent layer on the surface of the plated Ni—Zn alloy layer as rust proofing layer.

The electrodeposited copper foil with carrier foil with primer resin layer of the present invention preferrably comprises a bonding interface layer, a bulk copper layer, a rust proofing layer and a primer resin layer which are formed in this order on the surface of at least one side of the carrier foil. The rust proofing layer is constituted by a plated Ni—Zn alloy layer and a chromate layer, wherein a roughness $R_{zjis}$ measured on the surface of said chromate layer is not more than 3 μm and said plated Ni—Zn alloy layer contains Ni and Zn, and Ni/Zn deposit amount ratio in the layer is 1.5 to 10.

The electrodeposited copper foil with carrier foil with primer resin layer of the present invention is preferred to be that said rust proofing layer comprises on the surface a silane coupling agent layer, even when the rust proofing layer comprises a plated Ni—Zn alloy layer and a chromate layer.

Said primer resin layer present in the electrodeposited copper foil with carrier foil with primer resin layer of the present invention is preferred to be a semi-cured primer resin composition which contains an epoxy resin and a polyether sulfone having functions selected from a hydroxyl group or an amino group or both groups at its ends.

Said primer resin composition used to form the primer resin layer contained in the present invention is preferred to have a composition balance of epoxy resin of 5% by weight to 50% by weight and polyether sulfone resin of 95% by weight to 50% by weight based on a total weight of said epoxy resin and said polyether sulfone being 100% by weight, whereby said polyether sulfone comprises a hydroxyl group or an amino group or both groups at its ends.

Said primer resin composition used to form the primer resin layer of the present invention is preferred to further contain an epoxy resin curing agent.

When epoxy curing agent is mixed to the primer resin composition to manufacture the electrodeposited copper foil with carrier foil with primer resin layer of the present invention, said primer resin composition is preferred to have a composition balance, wherein a sum of said epoxy resin and said epoxy resin curing agent of 5% by weight to 50% by weight, and said polyether sulfone resin of 95% by weight to 50% by weight, assumed the total weight of said epoxy resin, said epoxy resin curing agent and said polyether sulfone is 100% by weight.

Said primer resin composition used to form the primer resin layer contained in the present invention is preferred to use an epoxy resin made by epoxy-monomers having a structure shown in following formula (1).

[Formula 1]

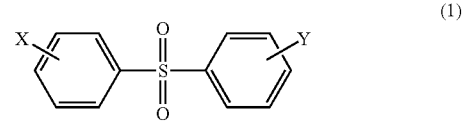

In the formula, X and Y represent the same formula expressed by formula (2).

[Formula 2]

$$—O—CH_2—CH—CH_2 \atop \diagdown O \diagup \quad (2)$$

When said epoxy resin curing agent is used in the primer resin composition for forming the primer resin layer contained in the present invention, the epoxy resin curing agent is preferred to have a structure shown in following formula (3).

[Formula 3]

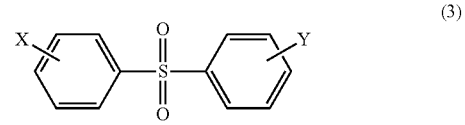

In the formula, either of X and Y is —OH or —NH$_2$, and X and Y may be the same or different.

The primer resin layer contained in the present invention is preferred to be a semi-cured primer resin composition of an epoxy resin curing agent and an epoxy resin, whereby the epoxy resin has a structure shown in formula (1).

The primer resin layer contained in the present invention is preferred to be a semi-cured primer resin composition of an epoxy resin and an epoxy resin curing agent, whereby the epoxy resin curing agent has a structure shown in formula (3).

Said primer resin layer contained in the present invention is preferred to be a semi-cured primer resin composition further containing a polyether sulfone having functional groups selected from a hydroxyl group or an amino group or both groups at its ends.

Said primer resin layer contained in the present invention is preferred to be a semi-cured primer resin composition further containing a silane coupling agent.

When said silane coupling agent containing primer resin composition is applied, the content of said silane coupling agent is preferred to be 0.1 parts by weight to 5 parts by weight based on 100 parts by weight of said primer resin composition.

Said primer resin layer of the electrodeposited copper foil with carrier foil of the present invention is preferably applied by using said primer resin composition which contains a sulfur content of 0.6% by weight or more.

Said primer resin layer constituting the electrodeposited copper foil with carrier foil of the present invention is preferred to have an equivalent thickness of 1 μm to 5 μm.

Said plated Ni—Zn alloy layer of the rust proofing layer of the electrodeposited copper foil with carrier foil with primer resin layer of the present invention is preferred to have an amount of Ni therein of 1 mg/m$^2$ to 50 mg/m$^2$.

The carrier foil of the present invention is preferred to be a copper foil.

As for the method of manufacturing the electrodeposited copper foil with carrier foil with primer resin layer of the present invention described above, it is preferred to apply a manufacturing method which contains process steps a) to f) shown below.

a) Process to contact a carrier foil on at least one surface with a solution containing bonding interface forming agents.

b) Bonding interface layer forming process to form a bonding interface layer on the carrier foil by fixing the bonding interface forming agents contacted with said carrier foil.

c) Bulk copper layer forming process to form bulk copper layer on the bonding interface layer by electro-plating a bulk copper layer on the carrier foil with bonding interface layer by using a bulk copper plating solution.

e) Rust proofing layer forming process to form a rust proofing layer on said bulk copper layer, by forming an electroplated Ni—Zn alloy layer using a Ni—Zn-containing plating solution at least, followed by forming a chromate layer or adsorbing a silane coupling agent by using conventional method as required.

f) Primer resin layer forming process to form primer resin layer on said copper foil with carrier foil after finishing rust proofing process by coating a primer resin composition or a silane coupling agent containing primer resin composition on said rust proofing layer.

The plating solution used for forming the plated Ni—Zn alloy layer of the rust proofing layer preferably has a concentration ratio of Ni ion concentration to Zn ion concentration [Ni/Zn] within 1.5 to 27.

Advantages of the Invention

Even when the electrodeposited copper foil comprises a surface treated layer of a plated Ni—Zn alloy layer and the like with a low profile, the electrodeposited copper foil with carrier foil with a primer resin layer of the present invention provides sufficient adhesion within the said surface and a resin substrate because of the presence of a primer resin layer with adequate surface treatment. In addition, because the surface treated layer comprises a plated Ni—Zn alloy layer and the like formed on the electrodeposited copper foil layer, delamination of the resin substrate hardly occurs, even if the bulk layer has defects like pin-holes and/or if the inside wall of through holes and/or via holes are contacted with desmear solution, i.e., it is superior in chemical resistance. Also, the manufacturing method is suitable for manufacturing the electrodeposited copper foil with carrier foil with a primer resin layer of the present invention.

BEST MODE FOR CARRYING OUT THE INVENTION

Electrodeposited Copper Foil with Carrier Foil with a Primer Resin Layer of the Present Invention The electrodeposited copper foil with carrier foil with a primer resin layer of the present invention is provided with a bonding interface layer, a bulk copper layer, a plated Ni—Zn alloy layer and a primer resin layer which are formed in this order on at least one surface of the carrier foil.

(Carrier Foil)

The carrier foil used in the present invention can be selected from foils which are capable for electrolytic deposition on its surface to form a bulk copper layer, such as aluminum foil, copper foil, resin film that has been subjected to metal coating on its surface and the like. In addition, as the copper foil, any of wrought copper foil and electrodeposited copper foil can be used. Among them, copper foil is preferable as carrier foil because collecting and recycling of the carrier foil after releasing is easy.

The thickness of the carrier foil is not limited in particular, but is usually not more than 200 μm and is preferable to be 18 μm to 200 μm. It is not preferred that the thickness of the carrier foil is less than 18 μm, because the mechanical strength and handling property of the carrier foil may not be good. In addition, a thickness of the carrier foil of more than 200 μm is not so preferable, because the handling property may not be good, while the manufacturing cost of the carrier foil may be expensive.

(Bonding Interface Layer)

In the electrodeposited copper foil with carrier foil with a primer resin layer of the present invention, a bonding interface layer is formed on at least one surface of the carrier foil. That is, the bonding interface layer may be formed on either one surface of the carrier foil or may be formed on both surfaces.

In the present invention, the bonding interface layer is formed between the carrier foil and the bulk copper layer provided by electrodeposition on the surface of the carrier foil, and is intended to decrease the release strength of the carrier foil and to secure the stability of the release strength level. Moreover, it functions as a barrier for occurrence of mutual diffusion between the carrier foil and the electrodeposited copper foil at the time of hot pressing. Here, the bonding interface layer of the present invention, which is, in particular, formed by an organic bonding interface layer forming component and described later, may remain on the surface of the bulk copper layer after releasing the carrier foil and can be easily removed by acid cleaning with dilute acid such as dilute sulfuric acid, dilute hydrochloric acid and the like. Therefore, no problem may come into manufacturing of a printed wiring board.

The bonding interface layer is formed on at least one surface of the carrier foil by contacting the carrier foil with the bonding interface layer forming agent.

The bonding interface layer forming agent used in the present invention comprises the bonding interface layer forming component to be fixed on the carrier foil to form the bonding interface layer and a solvent for the bonding interface layer forming component. As a bonding interface layer forming component may be used an organic bonding interface layer forming component such as, for example, a nitrogen-containing organic compound, a sulphur-containing organic compound, and a carboxylic acid or the like, and an inorganic bonding interface layer forming component such as, for example, Cr, Zn, chromate or the like.

Among organic bonding interface layer forming components, as a nitrogen-containing organic compound, a triazole compound, an imidazole compound and the like, for example, can be used. Among them, a triazole compound can form a bonding interface layer being thin and with approximately uniform thickness on the copper surface and therefore, the releasability of the bonding interface layer is stable in the case when the carrier foil is a copper foil. For example, triazole compounds that may be used in the present invention, are 1,2,3-benzotriazole, carboxy benzotriazole, N',N'-bis (benzotriazolyl methyl)urea, 1H-1,2,4-triazole, 3-amino-1H-1,2,4-triazole and the like.

Among organic bonding interface layer forming components, as a nitrogen-containing organic compound, mercapto benzothiazole, a thiocyanate acid and 2-bensimidazolethiol and the like, for example, can be used.

Among organic bonding interface layer forming components, as a carboxylic acid, a mono carboxylic acid, a dicarboxylic acid and the like, for example, can be used.

As solvent to dissolve the above described bonding interface layer forming component, water, ethanol and the like can be used. Among them, water is preferable because of its low costs and it is free from any concern about environmental pollution after removal.

As a method of contacting the bonding interface layer forming agent to the surface of carrier foil, a method of immersing the carrier foil into a bonding interface layer forming agent, a method of spraying the bonding interface layer forming agent to the carrier foil, a method to flow the bonding interface layer forming agent to stream down on the carrier foil and the like may be applicable. These methods can be used alone or in combination of two or more.

In addition, methods of fixing the bonding interface layer forming component to the surface of the carrier foil may be, for example, heat drying the bonding interface layer forming agent on the carrier foil surface, or electrodepositing the bonding interface layer forming component to the carrier foil surface and the like.

The thickness of the bonding interface layer is usually 1 nm to 1 µm and preferably 5 nm to 500 nm. The thickness of the bonding interface layer of less than 1 nm does not show a sufficient performance of the bonding interface layer, while a thickness in excess of 1 µm makes it difficult to form a bulk copper layer by the electrodeposition process, and are therefore not preferable.

(Bulk Copper Layer)

In the present invention, a bulk copper layer is a copper layer formed on the surface of a bonding interface layer by electrodeposition In the case where the above described bonding interface layer is formed on both surfaces of the carrier foil, the bulk copper layer may be formed on the respective surfaces of the two bonding interface layers that are present on the both surfaces of the carrier foil, or may be formed on only any one of the surfaces of the two bonding interface layers. In the former case, the layers will be configured by bulk copper layer/bonding interface layer/carrier foil/bonding interface layer/bulk copper layer while in the latter case the layers will be configured in the order bonding interface layer/carrier foil/bonding interface layer/bulk copper layer.

The thickness of the bulk copper layer may be set appropriately depending on the application of the electrodeposited copper foil with carrier foil with a primer resin layer and will not be limited in particular. However, in case of using a bulk copper layer of the electrodeposited copper foil with carrier foil with a primer resin layer of the present invention as it is or after subjecting to copper plating thereon to have a thicker copper layer, the thickness of the bulk copper layer is usually 0.5 µm to 8 µm, preferably 0.5 µm to 6 µm and moreover preferably 0.5 µm to 2.5 µm. The thickness of the bulk copper layer falling within said range will enable thinning of a printed wiring board as well as a finer pitch in the circuit.

Roughness $R_{zjis}$ on a surface of the bulk copper layer at the side that does not face the carrier foil, that is the surface at the side in a thickness increasing direction of the bulk copper layer by electrolytic deposition (deposition side surface of bulk copper layer) is usually not more than 3 µm, preferably not more than 2.3 µm and most preferably not more than 1.6 µm. $R_{zjis}$ falling within said range makes it easy to control the surface roughness of a plated Ni—Zn alloy layer or chromate treated layer formed on the bulk copper layer. Furthermore, it allows making a fine circuit formed from the bulk copper layer and substantially eliminates an etching residue and makes impedance control easy. In the present invention, $R_{zjis}$ means Ten-Point Height of Roughness Profile defined in JIS B0601-2001.

In a conventional electrodeposited copper foil with carrier foil, a roughening treatment such as a nodular treatment and the like is carried out to form minute copper particles on the deposition side surface of the bulk copper layer in order to increase the bonding strength. In contrast, the electrodeposited copper foil with carrier foil with a primer resin layer of the present invention is provided with a primer resin layer being formed on the deposition side surface of bulk copper layer to sufficiently increase the above described bonding strength, and therefore, although a roughening treatment is not necessarily indispensable, it may be carried out appropriately as far as roughness $R_{zjis}$ of the bulk copper layer deposition side falls within the above described range. In the present invention, a bulk copper layer that has been subjected to the above described roughening treatment is called a bulk copper layer inclusive of the roughening treatment. In case of carrying out a roughening treatment, the plated Ni—Zn alloy layer is formed on the deposition side surface of the bulk copper layer that has been subjected to a roughening treatment.

(Rust Proofing Layer)

A plated Ni—Zn alloy layer of a rust proofing layer is a metallic layer formed by electrodeposition on a deposition side surface of a bulk copper layer or a surface of a bulk copper layer deposition side after carrying out a roughening treatment as required, and is made to provide rust proofing effects to the bulk copper layer. The plated Ni—Zn alloy layer is a plated layer containing at least Ni and Zn, and the layer may further contain elements such as Sn, Cr or Co and the like as required. That is, the plated Ni—Zn alloy layer may be a binary alloy layer made of just Ni and Zn, or may be a ternary alloy layer to a quinary alloy layer containing one kind to three kinds of Sn, Cr or Co in addition thereto.

For the plated Ni—Zn alloy layer, said plated Ni—Zn alloy layer contains Ni and Zn, and the Ni/Zn deposit amount ratio in the layer is 1.5 to 10, preferably 2 to 7 and more preferably 2.7 to 4. In the present invention, the Ni/Zn deposit amount ratio means the ratio of Ni amount divided by Zn amount contained in the plated Ni—Zn alloy layer. When the ratio is falling within the range, delamination of the interface between the bulk copper layer and the resin substrate layer can be eliminated even when the bulk copper layer is treated with an acid cleaning solution or an etching solution in a state that pin holes and the like remain.

On the other hand, the above described ratio of less than 1.5 or in excess of 10 is not so preferable, because it may be inferior in chemical resistance against a desmear solution and the like. Here, the Ni/Zn deposit amount ratio can be calculated from the value of Zn deposit ($mg/m^2$) and Ni deposit ($mg/m^2$) in the plated Ni—Zn alloy layer which are converted from concentrations of Ni and Zn in the solution obtained by dissolving the plated Ni—Zn alloy layer in an acid and the like, and by carrying out ICP optical emission spectrometry on the solution.

In addition, Ni deposit in the plated Ni—Zn alloy layer is usually 1 $mg/m^2$ to 50 $mg/m^2$, and preferably 10 $mg/m^2$ to 35 $mg/m^2$, and more preferably 15 $mg/m^2$ to 30 $mg/m^2$. As for the plated Ni—Zn alloy layer, in the case where the above described Ni/Zn deposit amount ratio falls within the above described range, and moreover in the case where the Ni deposit falls within the range, delamination of the interface between the bulk copper layer and the resin substrate layer will be eliminated even when processing with an acid cleaning solution or an etching solution are performed in a state where pin holes and the like remain in the bulk copper layer, and the bulk copper layer shows good etchability, so it is preferable.

On the other hand, a Ni deposit of less than 10 mg/m$^2$ may cause discoloration by oxidation in the bulk copper layer surface and is not so preferable. In addition, a Ni deposit in excess of 35 mg/m$^2$ may worsen the removability of the plated Ni—Zn alloy layer, so it is not so preferable.
(Chromate Layer)

In the present invention, a chromate layer may be formed on the surface of the plated Ni—Zn alloy layer as required. Forming a chromate layer increases rust proofing ability of a bulk copper layer, so it is preferable. Here, since the chromate layer is formed on the surface of a plated Ni—Zn alloy layer, in case of forming a chromate layer, respective layers of the electrodeposited copper foil with carrier foil with a primer resin layer will be: carrier foil, a bonding interface layer, a bulk copper layer, a plated Ni—Zn alloy layer, a chromate layer and a primer resin layer in this order. The chromate layer can be formed by a popular chromate treatment.

The electrodeposited copper foil with carrier foil with a primer resin layer of the present invention has, as described above, carrier foil, a bonding interface layer, a bulk copper layer and a plated Ni—Zn alloy layer comprising at least Ni and Zn, and moreover a chromate layer formed on the surface of the plated Ni—Zn alloy layer.
(Silane Coupling Agent Layer)

In the present invention, a silane coupling agent layer may be formed on the surface of a plated Ni—Zn alloy layer or a chromate layer as required. Forming the silane coupling agent layer may increase the humidity resistance, chemical resistance against desmear solution and the like and peel strength of the electrodeposited copper foil with carrier foil with a primer resin layer, so it is preferable.

After the silane coupling agent layer is formed on the surface of a plated Ni—Zn alloy layer or a chromate layer, respective layers of the electrodeposited copper foil with carrier foil with a primer resin layer will be: carrier foil/a bonding interface layer/a bulk copper layer/a plated Ni—Zn alloy layer/a silane coupling agent layer/a primer resin layer in this order, or carrier foil/a bonding interface layer/a bulk copper layer/a plated Ni—Zn alloy layer/a chromate layer/a silane coupling agent layer/a primer resin layer in this order. The silane coupling agent layer can be formed by applying appropriately diluted silane coupling agent, followed by drying.

As a silane coupling agent may be used in the present invention, for example, an epoxy functional silane coupling agent such as 4-glycidyl butyl trimethoxy silane and γ-glycidoxypropyltrimethoxy silane and the like; an amino functional silane coupling agent such as γ-aminopropyltrimethoxy silane, N-β(aminoethyl)γ-aminopropyltrimethoxy silane, N-3-(4-(3-aminopropoxy)butoxy)propyl-3-aminopropyltrimethoxy silane, and N-phenyl-γ-aminopropyltrimethoxy silane, and the like; a mercapto functional silane coupling agent such as γ-mercaptopropyltrimethoxysilane and the like; an olefin functional silane coupling agent such as vinyltrimethoxy silane and vinylphenyltrimethoxy silane, and the like; an acrylic functional silane coupling agent such as γ-methacryloxypropyltrimethoxy silane and the like; an imidazole functional silane coupling agent such as imidazole silane and the like; a triazine functional silane coupling agent such as triazine silane and the like can be used.
(Primer Resin Layer)

A primer resin layer is a resin layer formed on the surface of a plated Ni—Zn alloy layer by semi-curing of a primer resin composition or a primer resin composition containing a silane coupling agent to improve bonding strength between a bulk copper layer and a resin substrate layer.

As a primer resin composition used in the present invention, the following four composition types may be used. That is, among the primer resin compositions used in the present invention, a first composition contains epoxy resin and polyether sulfone having a hydroxyl group, amino group or both groups at its ends (hereinafter referred to "first primer resin composition"), a second composition contains an epoxy resin having a structure shown in following formula (1) and an epoxy resin curing agent (hereinafter referred to "second primer resin composition"), a third composition contains an epoxy resin and an epoxy resin curing agent having a structure shown in formula (3) (hereinafter referred to "third primer resin composition") and a fourth composition contains an epoxy resin having the formula (1) and an epoxy resin curing agent having a structure shown in formula (3) (hereinafter referred to "fourth primer resin composition").

In addition, primer resin composition containing a silane coupling agent used in the present invention consists of the above described primer resin composition mixed with a silane coupling agent.
<First Primer Resin Composition>

Following, a first primer resin composition will be described. The epoxy resin used in the first primer resin composition is not limited in particular, but a popular one can be used. As the epoxy resin, for example, bisphenyl sulfone type epoxy resin, bisphenol A type epoxy resin, bisphenol F type epoxy resin, bisphenol S type epoxy resin, novolac type epoxy resin, cresol novolac type epoxy resin, bromined epoxy resin, alicyclic epoxy resin, glycidyl amine type epoxy resin, biphenyl type epoxy resin, trifunctional epoxy resin and the like can be used. Among them, employing of bisphenol S type epoxy resin as epoxy resin may increase peel strength and it is preferable. In addition, when trifunctional epoxy resin and the like are employed as a multifunctional epoxy resin, it may increase the heat resistance of the printed wiring board obtained, so it is preferable.

For example, the bisphenyl sulfone type epoxy resin used in the first primer resin composition may include those having a structure shown in formula (1).

The first primer resin composition with an epoxy resin having a structure as shown in the above described formula (1) may increase peel strength of the bulk copper layer within the resin substrate layer. In the first primer resin composition, epoxy resin can be used alone or in combination with two or more among those described above.

Polyether sulfone used in the first primer resin composition has a basic structure expressed by the following formula 4 and has a hydroxyl group, an amino group or both groups at the ends. Here, it is advisable that polyether sulfone expressed by the formula 4 has a basic structure enclosed with parenthesis to which "n" is attached and has a hydroxyl group, an amino group or the both of them. Further, a structure such as a benzene ring and the like may be appropriately included between the basic structure and ends. Because the polyether sulfone contains a hydroxyl group, an amino group or both of them at its ends, they can combine with epoxy resin and be semi-cured.

[Formula 4]

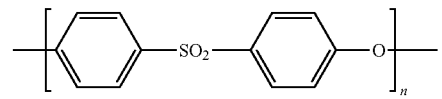

For example, the first primer resin composition is obtained by mixing the above described epoxy resin and polyether sulfone containing a hydroxyl group, an amino group or both of them at its ends. In addition, an organic solvent may be mixed to the first primer resin composition at the time of preparation or after preparation in order to adjust the viscosity for the purpose of improving coating ability.

The first primer resin composition contains the epoxy resin of usually 5% by weight to 50% by weight and preferably 15% by weight to 40% by weight and polyether sulfone having a hydroxyl group, an amino group or the both of them at the end(s) of usually 95% by weight to 50% by weight and preferably 85% by weight to 60% by weight, based on 100% by weight of total weight of the epoxy resin and the polyether sulfone contained in the primer resin composition.

With mixing ratio of epoxy resin to polyether sulfone having a hydroxyl group, an amino group or the both of them at the end(s) falling within the above described range, deviation of the surface insulating resistance of a printed wiring board formed with electrodeposited copper foil with carrier foil with a primer resin layer using the first primer resin composition may get smaller, so it is preferable.

On the other hand, with epoxy resin being less than 5% by weight, thermal curing is not performed sufficiently and cause insufficient bonding strength between the bulk copper layer and the resin substrate layer, so it is not so preferable. In addition, epoxy resin in excess of 50% by weight decreases toughness of the primer resin layer to cause micro-cracks on the substrate surface, so it is not so preferable.

The first primer resin composition may be mixed with an epoxy resin curing agent as required. As the epoxy resin curing agent, amines such as dicyandiamide, imidazoles, diaminodiphenyl sulfone and aromatic amine and the like; phenols such as bisphenyl sulfone type phenol resin, bisphenol S, bisphenol A and bromined bisphenol A and the like; novolacs such as phenol novolac resin and cresol novolac resin and the like; acid anhydride such as phthalic anhydride and the like can be used, for example.

As the above described diaminodiphenyl sulfone or bisphenyl sulfone type phenol resin, those having a structure shown in the formula (3) can be used.

Here, in case of either one of X and Y being —OH and the other being —NH$_9$ in formula (3), a compound of formula (3) corresponds to both diaminodiphenyl sulfone and bisphenyl sulfone type phenol resin.

The first primer resin composition with an epoxy resin curing agent structured shown in the above described formula (3) may increase peel strength, so it is preferable. In the first primer resin composition, the above described epoxy resin curing agents can be used alone or in combination of two or more among those described above.

The first primer resin composition contains the epoxy resin and the epoxy resin curing agent in a sum of usually 5% by weight to 50% by weight and preferably 15% by weight to 40% by weight, and polyether sulfone having a hydroxyl group, an amino group or both of them at the end(s) of usually 95% by weight to 50% by weight and preferably 85% by weight to 60% by weight, based on the total weight of the epoxy resin, the epoxy resin curing agent and the polyether sulfone being 100% by weight.

With a mixing ratio of the epoxy resin, the epoxy resin curing agent and the polyether sulfone falling within the above described range, deviation of surface insulating resistance of a printed wiring board formed with electrodeposited copper foil with carrier foil with a primer resin layer using the first primer resin composition may get smaller, so it is preferable.

On the other hand, with total amount of the epoxy resin and the epoxy resin curing agent being less than 5% by weight, thermal curing is not performed sufficiently and thereby bonding strength between the bulk copper layer and the resin substrate layer may become insufficient, so it is not so preferable. In addition, total amount of epoxy resin and the epoxy resin curing agent in excess of 50% by weight decreases toughness of the primer resin layer and may cause microcracks on the substrate surface, so it is not so preferable.

The first primer resin composition may appropriately contain a curing accelerator and the like different from the above described epoxy resin, polyether sulfone having a hydroxyl group, an amino group or the both of them at the end(s) and or the epoxy resin curing agent mixed as required. As a curing accelerator used in the present invention, tertiary amine, imidazole, phosphor compound such as triphenylphosphine and the like, a urea derived curing accelerator and the like can be used, for example.

<Second Primer Resin Composition>

Next, a second primer resin composition will be described. In the second primer resin composition, bisphenyl sulfone type epoxy resin having a structure shown in the above described formula (1) is used at least for epoxy resin, and bisphenol A type epoxy resin, bisphenol F type epoxy resin, bisphenol S type epoxy resin, novolac type epoxy resin, cresol novolac type epoxy resin, bromined epoxy resin, alicyclic type epoxy resin, glycidyl amine type epoxy resin, biphenyl type epoxy resin, trifunctional epoxy resin and the like are used, as required.

In the second primer resin composition, epoxy resin which is used in combination with bisphenyl sulfone type epoxy resin having a structure shown in formula (1) as required, can be used alone or in combination of two or more among those described above.

As an epoxy resin curing agent used in the second primer resin composition, amines such as dicyandiamide, imidazoles and aromatic amines excepting diaminodiphenyl sulfone having a structure shown in formula (3), phenols excepting bisphenyl sulfone type phenol resin having a structure shown in formula (3) such as bisphenol S, bisphenol A and bromined bisphenol A, novolacs such as phenol novolac resin and cresol novolac resin and acid anhydrides such as phthalic anhydride can be shown as an example.

For example, the second primer resin composition is obtained by mixing epoxy resin having a structure shown in the above described formula (1) and an epoxy resin curing agent. In addition, an organic solvent may be mixed to the second primer resin composition at the time of preparation or after preparation in order to adjust the viscosity for the purpose of improving coating ability.

The second primer resin composition contains at least a bisphenyl sulfone type epoxy resin having a structure shown in the above described formula (1) as epoxy resin. It resembles a basic structure of polyether sulfone, and the epoxy resin has a function for increasing bonding strength between the bulk copper layer and the resin substrate layer as polyether sulfone, and therefore even without polyether sulfone, bonding strength between the bulk copper layer and the resin substrate layer of the second primer resin composition can be increased sufficiently. However, by further mixing of polyether sulfone, bonding strength between the bulk copper layer and the resin substrate layer can be even more increased, so it is preferable. As the polyether sulfone, the same one as that used in the first primer resin composition can be used.

<Third Primer Resin Composition>

Next, a third primer resin composition will be described. As epoxy resin used in the third primer resin composition, those different from bisphenyl sulfone type epoxy resin having a structure shown in formula (1) are employed. For example, bisphenol A type epoxy resin, bisphenol F type epoxy resin, bisphenol S type epoxy resin, novolac type epoxy resin, cresol novolac type epoxy resin, bromined type epoxy resin, alicyclic type epoxy resin, glycidyl amine type epoxy resin, biphenyl type epoxy resin, trifunctional type epoxy resin and the like can be used.

In the third primer resin composition, diaminodiphenyl sulfone having a structure shown in formula (3) described above and/or bisphenyl sulfone type phenol resin having a structure shown in formula (3) described above is at least used for epoxy resin curing agent, and as required, amines such as dicyandiamide, imidazoles and aromatic amines excepting diaminodiphenyl sulfone having a structure shown in formula (3), phenols excepting bisphenyl sulfone type phenol resin having a structure shown in formula (3) such as bisphenol S, bisphenol A and bromined bisphenol A, novolacs such as phenol novolac resin and cresol novolac resin and acid anhydrides such as phthalic anhydride are used.

Here, in case of either one of X and Y being —OH and the other being —NH$_2$ in formula (3), a compound of formula (3) corresponds to both diaminodiphenyl sulfone and bisphenyl sulfone type phenol resin.

In the third primer resin composition, the above described epoxy resin curing agents, which are used in combination with an epoxy resin curing agent having a structure shown in formula (3), can be used alone or in combination of two or more among those described above.

For example, the third primer resin composition is prepared by mixing the above described epoxy resin and an epoxy resin curing agent having a structure shown in formula (3). In addition, an organic solvent may be mixed with the third primer resin composition at the time of preparation or after preparation in order to adjust the viscosity for the purpose of improving coating performance.

The third primer resin composition contains an epoxy resin curing agent having a structure shown in the above described formula (3) as an epoxy resin curing agent at least. It resembles a basic structure of polyether sulfone, and the epoxy resin curing agent has a function of increasing bonding strength between the bulk copper layer and the resin substrate layer as polyether sulfone, and therefore even without polyether sulfone, bonding strength between the bulk copper layer and the resin substrate layer of the third primer resin composition can be increased sufficiently. However, by further mixing polyether sulfone; bonding strength between the bulk copper layer and the resin substrate layer can be even more increased, so it is preferable. As the polyether sulfone, the same one as that used in the first primer resin composition can be used.

<Fourth Primer Resin Composition>

Next, a fourth primer resin composition will be described. Epoxy resin used in the fourth primer resin composition is the same as those used in the second primer resin composition. That is, in the fourth primer resin composition, bisphenyl sulfone type epoxy resin having a structure shown in the above described formula (1) is at least used for epoxy resin. Moreover, bisphenol A type epoxy resin, bisphenol F type epoxy resin, bisphenol S type epoxy resin, novolac type epoxy resin, cresol novolac type epoxy resin, bromined epoxy resin, alicyclic type epoxy resin, glycidyl amine type epoxy resin, biphenyl type epoxy resin, trifunctional epoxy resin and the like can be used in addition.

In the fourth primer resin composition, the above described epoxy resin, which is used in combination with bisphenyl sulfone type epoxy resin having a structure shown in formula (1), can be used alone or in combination of two or more among those described above.

The epoxy resin curing agent used in the fourth primer resin composition is the same as the one used in the third primer resin composition. That is, in the fourth primer resin composition, diaminodiphenyl sulfone having a structure shown in formula (3) and/or bisphenyl sulfone type phenol resin having a structure shown in formula (3) described above is at least used for epoxy resin curing agent. Moreover, amines such as dicyandiamide, imidazoles and aromatic amines, and phenols such as bisphenol S, bisphenol A and bromined bisphenol A, novolacs such as phenol novolac resin and cresol novolac resin and acid anhydrides such as phthalic anhydride may be used in addition.

Here, in case of either one of X and Y being —OH and the other being —NH$_2$ in formula (3), a compound of formula (3) corresponds to both diaminodiphenyl sulfone and bisphenyl sulfone type phenol resin.

In the fourth primer resin composition, the above described epoxy resin curing agents, which are used in combination with an epoxy resin curing agent having a structure shown in formula (3), can be used alone or in combination of two or more among those described above.

For example, the fourth primer resin composition is prepared by mixing epoxy resin having a structure shown in the above described formula (1) and an epoxy resin curing agent having a structure shown in formula (3). In addition, an organic solvent may be mixed to the fourth primer resin composition at the time of preparation or after preparation in order to adjust the viscosity for the purpose of improving coating ability.

The fourth primer resin composition contains bisphenyl sulfone type epoxy resin having a structure shown in the above described formula (1) as epoxy resin, at least. It resembles a basic structure of polyether sulfone, and the epoxy resin has a function of increasing bonding strength between the bulk copper layer and the resin substrate layer as polyether sulfone. Furthermore, it contains at least an epoxy resin curing agent having a structure shown in the above described formula (3) which resembles a basic structure of polyether sulfone. Accordingly, the epoxy resin curing agent has a function of increasing bonding strength between the bulk copper layer and the resin substrate layer as polyether sulfone. Therefore even without polyether sulfone, bonding strength between the bulk copper layer and the resin substrate layer of the fourth primer resin composition can be increased sufficiently. However, by further mixing polyether sulfone; bonding strength between the bulk copper layer and the resin substrate layer can be even more increased, so it is preferable. As the polyether sulfone, the same one as that used in the first primer resin composition can be used.

In the above described first to the fourth primer resin compositions, a content of sulfur in the layer of 0.6% by weight or more may increase affinity with metals such as copper and the like, so it is preferable.

<Primer Resin Composition Including a Silane Coupling Agent>

Next, a primer resin composition including a silane coupling agent will be described. A primer resin composition including a silane coupling agent consists of the above described primer resin composition and a silane coupling agent. Because the primer resin composition is the same as the one described in the section for the primer resin composition, description thereof will be omitted.

Because the primer resin composition contains a silane coupling agent, the primer resin layer obtained by semi-curing the primer resin composition contains a silane coupling agent as well. The primer resin layer formed with the primer resin composition including a silane coupling agent may show higher bonding strength between the bulk copper layer and the resin substrate layer, when compared with the primer resin layer formed of a primer resin composition without a silane coupling agent. Therefore, in case of using the primer resin composition including a silane coupling agent as a raw material for producing the primer resin layer, forming of a silane coupling agent layer can be omitted. However, in case of using the primer resin composition including a silane coupling agent as a raw material for forming the primer resin layer, forming of the silane coupling agent layer individually may further increase bonding strength between the bulk copper layer and the resin substrate layer.

The primer resin composition including a silane coupling agent contains usually 0.1 parts by weight to 5 parts by weight and preferably 0.5 parts by weight to 3 parts by weight of the silane coupling agent with respect to 100 parts by weight of the primer resin composition. Mixing the silane coupling agent to the primer resin composition in these amounts, may increase the bonding strength between the bulk copper layer and the resin substrate layer sufficiently, even without forming a silane coupling agent layer individually, so it is preferable.

On the other hand, mixing the silane coupling agent to the primer resin composition in amounts less than 0.1 parts by weight, without forming a silane coupling agent layer individually, bonding strength between the bulk copper layer and the resin substrate layer may hardly increase sufficiently, so it is not so preferable. In addition, with the mixing ratio of the silane coupling agent in excess of 5 parts by weight, heat resistance of the primer resin layer may not be sufficient, so it is not so preferable.

The primer resin layer is obtained by semi-curing the above described primer resin composition or the primer resin composition including a silane coupling agent. The method of semi-curing the primer resin composition or the primer resin composition including a silane coupling agent will not be limited in particular, but popular methods such as leaving materials after mixing and the like can be employed. For example, mixing of the above described epoxy resin and polyether sulfone followed by hot air drying can perform semi-curing.

Equivalent thickness of the primer resin layer is usually 1 μm to 5 μm and preferably 1.5 μm to 4.0 μm. Here, equivalent thickness is a thickness measured in the condition when primer resin composition is coated on an ideal flat plane and then cured completely. With the thickness falling within the range, the bulk copper layer surface can be coated to provide uniform thickness and bonding strength with the resin substrate layer is high, so it is preferable. On the other hand, with the thickness being less than 1 μm, it may be difficult to cover the bulk copper layer surface with uniform thickness, so it is not so preferable. In addition, the thickness in excess of 5 μm may show tendency to cause interface delamination within the resin substrate layer, so it is not so preferable.

The electrodeposited copper foil with carrier foil with a primer resin layer of the present invention having above described layer construction has a roughness $R_{zjis}$ measured on a surface of the plated Ni—Zn alloy layer of not more than 3 μm, preferably not more than 2.3 μm and more preferably not more than 1.6 μm. $R_{zjis}$ falling within the range enables a finer circuit formation from the bulk copper layer, eliminate occurrence of an etching residue, and make impedance control easy, so it is preferable.

In addition, in the case where a chromate layer is formed, the electrodeposited copper foil with carrier foil with a primer resin layer of the present invention has roughness $R_{zjis}$ measured on the chromate layer not more than 3 μm, preferably not more than 2.3 μm and more preferably not more than 1.6 μm. $R_{zjis}$ falling within the range enables a finer circuit formation from the bulk copper layer, eliminates occurrence of an etching residue, and makes impedance control easy, so it is preferable.

The electrodeposited copper foil with carrier foil with a primer resin layer of the present invention can be manufactured, for example, by a method as follows.

Method of Manufacturing the Electrodeposited Copper Foil with Carrier Foil with a Primer Resin Layer of the Present Invention A method of manufacturing the electrodeposited copper foil with carrier foil with a primer resin layer of the present invention includes a bonding interface layer forming process, a bulk copper layer forming process, a rust proofing layer forming process and a primer resin layer forming process as follows.

(Bonding Interface Layer Forming Process)

A bonding interface layer forming process employs contacting at least one surface of the carrier foil which is fed continuously with a bonding interface layer forming agent to fix the bonding interface layer forming component in the bonding interface layer forming agent on the above described surface to form a bonding interface layer.

As carrier foil used in the present step, the same one as carrier foil described in electrodeposited copper foil with carrier foil with a primer resin layer of the present invention can be used. As a method of continuously feeding carrier foil, for example, a method of unwinding a carrier foil from a rolled state can be applicable.

As a bonding interface layer forming agent used in the present process, the same one as the bonding interface layer forming agent described in electrodeposited copper foil with carrier foil with a primer resin layer of the present invention can be used. In addition, as a method of contacting at least one surface of carrier foil to the bonding interface layer forming agent, a method of immersing the carrier foil into a bonding interface layer forming agent, a method of spraying the bonding interface layer forming agent to the carrier foil, a method of streaming down the bonding interface layer forming agent to the carrier foil and the like can be used, for example. These methods can be used alone or in combination of two or more.

In addition, as a method of fixing the bonding interface layer forming component in the bonding interface layer forming agent onto the surface of the carrier foil, a method by drying the bonding interface layer forming agent on the carrier foil surface to fix the bonding interface layer forming component, a method by electrodepositing the bonding interface layer forming component in the bonding interface layer forming agent onto the carrier foil surface and the like can be used, for example.

In the present process, a bonding interface layer is formed on at least one surface of the carrier foil. In the present process, conditions are appropriately adjusted so as to provide thickness of the bonding interface layer formed of usually 1 nm to 1 μm and preferably 5 nm to 500 nm. The thickness of the bonding interface layer of less than 1 nm does not show a sufficient performance of the bonding interface layer and, in excess of 1 μm, it cause difficulty in forming a bulk copper layer, so it is not preferable.

(Bulk Copper Layer Forming Process)

A bulk copper layer forming process is employed to form a bulk copper layer by electrolysis on the surface of the above described bonding interface layer by immersing the carrier foil that has been subjected to the bonding interface layer forming process into a bulk copper forming electrolytic solution.

The electrolytic solution for bulk copper forming used in the present process is a copper plating solution capable of forming a copper layer on the bonding interface layer surface by electrolysis. As such a bulk copper forming electrolytic solution, a copper sulfate solution and the like is used, for example. Electrolysis conditions such as current density for forming a bulk copper layer are not limited in particular but may be adjusted appropriately.

Here, the bulk copper layer is formed on the surface of a bonding interface layer which is formed in the process of forming the bonding interface layer. The bulk copper layer does not always have to be formed on the bonding interface layer surface. That is, in the case where a bonding interface layer is formed on both surfaces of the carrier foil, forming a bulk copper layer on at least either one surface thereof will be carried out. Thus, as a method of forming a bulk copper layer on one surface, a method of setting an anode at the location in a predetermined distance apart from a surface of the carrier foil surfaces where a bulk copper layer is desired to be formed. For example, the carrier foil is immersed into a bulk copper forming electrolytic solution, and an electric current is supplied to make the carrier foil to be a cathode and to carry out electrolysis. Here, as a method of forming a bulk copper layer on both surfaces of the carrier foil, a method of setting anodes facing to both surfaces of the carrier foil and electric current is supplied to make the carrier foil to be a cathode to carry out electrolysis, or a method of setting an anode facing to one surface of carrier foil to make the carrier foil to be a cathode and another anode facing to another surface of carrier foil to make the carrier foil to be a cathode and electric current is supplied to carry out electrolysis can be used, for example. In the above described process, a bulk copper layer is formed on any of the surfaces containing a bonding interface layer.

(Rust Proofing Layer Forming Process)

To form the Ni—Zn alloy layer as a rust proofing layer, the carrier foil that has been subjected to the bulk copper layer forming process is immersed into a Ni—Zn-containing plating solution to carry out electrolysis for forming a plated Ni—Zn alloy layer on the surface of the above described bulk copper layer.

The Ni—Zn-containing plating solution used in the present process is a solution containing Ni ions and Zn ions. For example, the Ni—Zn-containing plating solution is prepared by dissolving a pyrophosphate such as potassium pyrophosphate, and the like and moreover by dissolving a nickel compound such as nickel sulfate and nickel acetate and the like as Ni ion source, and zinc compound such as Zinc pyrophosphate and zinc carbonate and the like as Zn ion source in pure water.

The Ni—Zn-containing plating solution has a ratio of the Ni ion concentration to the Zn ion concentration (Ni ion concentration/Zn ion concentration) of usually 1.5 to 27 and preferably 6 to 15. With the ratio falling within the range, the Ni/Zn deposit amount ratio of the plated Ni—Zn alloy layer formed on the surface of the bulk copper layer may become appropriate, so it is preferable.

On the other hand, with the above described ratio being less than 1.5, the Ni/Zn deposit amount ratio of the plated Ni—Zn alloy layer formed on the surface of the bulk copper layer may become too small, so it is not so preferable. In addition, with the ratio in excess of 27, the Ni/Zn deposit amount ratio of the plated Ni—Zn alloy layer formed on the surface of the bulk copper layer may become too large, so it is not so preferable.

In addition, for the Ni—Zn-containing plating solution, the Ni ion concentration is usually 1 g/l to 6 g/l and preferably 2 g/l to 5 g/l. With the Ni ion concentration falling within the range, the Ni/Zn deposit amount ratio of the plated Ni—Zn alloy layer formed on the surface of the bulk copper layer may become appropriate, so it is preferable.

On the other hand, with the Ni ion concentration being less than 1 g/l, deposit amount of both Ni and Zn in the plated Ni—Zn alloy layer may become too small, so it is not so preferable. In addition, with the Ni ion concentration in excess of 6 g/l, deposit amount of the both Ni and Zn in the plated Ni—Zn alloy layer formed on the surface of the bulk copper layer may become too large, so it is not so preferable.

For an electrolysis condition of forming the plated Ni—Zn alloy layer with the above described Ni—Zn-containing plating solution, current density is usually $0.1$ $A/dm^2$ to $3$ $A/dm^2$ and preferably $0.4$ $A/dm^2$ to $1.5$ $A/dm^2$. With the current density falling within the range, the Ni/Zn deposit amount ratio of the plated Ni—Zn alloy layer may fall within the above described preferable range, so it is preferable. Carrying out the above described process, a plated Ni—Zn alloy layer is formed on the surface of a bulk copper layer.

In addition, in the case that a chromate layer is formed, the chromate layer is formed on the Ni—Zn alloy layer formed by above described method. As method for forming the chromate layer, any popular method can be applicable, so the production method will not be limited in particular.

(Primer Resin Layer Forming Process)

A primer resin layer forming process is employed to coat a primer resin composition solution or a primer resin composition including a silane coupling agent solution onto a surface of the above described plated Ni—Zn alloy layer of carrier foil that has been subjected to the a plated Ni—Zn alloy layer forming process to form a primer resin layer.

The primer resin composition solution used in the present process consists of a primer resin composition and an organic solvent. The primer resin composition including a silane coupling agent solution used in the present process consists of a primer resin composition including a silane coupling agent and an organic solvent.

As the primer resin composition used in the present process, the same one as the primer resin composition described in electrodeposited copper foil with carrier foil with a primer resin layer of the present invention can be used.

In addition, as the primer resin composition including a silane coupling agent used in the present process, the same one as the primer resin composition including a silane coupling agent described in electrodeposited copper foil with carrier foil with a primer resin layer of the present invention can be used.

<Primer Resin Composition Solution>

Next, a primer resin composition solution will be described. Organic solvents used in a primer resin composition solution will not be limited in particular if it can dissolve those described above. For example, methyl ethyl ketone, cyclopentanone, dimethylformamide, dimethylacetamide, N-methyl-pyrrolidone γ-butyrolactone and the like can be used. The above described organic solvents can be used alone or in combination of two or more. Among them, cyclopentanone, dimethylformamide, dimethylacetamide, N-methylpyrrolidone, γ-butyrolactone has high dissolution ability for the polyether sulfone having a hydroxyl group or an amino group or the both at its ends, used in the present invention, so they are preferable.

Organic solvents used in a primer resin composition solution are preferably methyl ethyl ketone, cyclopentanone and a mixed solvent of methyl ethyl ketone and cyclopentanon, and more preferably a mixed solvent of methyl ethyl ketone and cyclopentanon. These organic solvents are easy to remove by evaporation at hot pressing in the manufacturing process of the copper-clad laminates. Also the evaporated gas can be easily cleaned up. Further, it makes easier the adjusting of the viscosity of a primer resin composition solution to be suitable for coating on the bulk copper layer surface where a plated Ni—Zn alloy layer has been formed.

The mixing ratio of the primer resin composition and the organic solvent in the primer resin composition solution for the first primer resin composition is different than in the other cases of the primer resin compositions, such as for the second primer resin composition, the third primer resin composition and the fourth primer resin composition. The primer resin composition in case of the first primer resin composition contains a lot of polyether sulfone which is a polymer hard to dissolve. The amount of the above described primer resin composition mixed with the organic solvent is usually 15% by weight to 35% by weight and preferably 20% by weight to 30% by weight, based on the total weight of both the primer resin composition and the organic solvent. The mixing ratio falling within the range may improve uniformity in film thickness of the formed primer resin composition, so it is preferable.

On the other hand, with the above described mixing ratio less than 15% by weight, the viscosity of the primer resin composition solution is too low to secure uniformity of film thickness of the formed primer resin composition, so it is not so preferable. In addition, with the above described mixing ratio in excess of 35% by weight, the viscosity of the primer resin composition is too high to cause difficulty in adjusting thickness of the film thickness of the formed primer resin layer, so it is not so preferable.

For the primer resin composition being the second primer resin composition, the third primer resin composition or the fourth primer resin composition, ratio of mixing the above described primer resin composition with the organic solvent is usually 30% by weight to 50% by weight and preferably 35% by weight to 45% by weight, based on the total weight of the both primer resin composition and the organic solvent as 100% by weight. The mixing ratio falling within the range may improve uniformity in film thickness of the formed primer resin composition, which is preferable.

On the other hand, with the above described mixing ratio less than 30% by weight, the viscosity of the primer resin composition solution is too low to secure uniformity of film thickness of the formed primer resin composition, so it is not so preferable. In addition, with the above described mixing ratio in excess of 50% by weight, the viscosity of the primer resin composition is too high to cause difficulty in adjusting thickness of the film thickness of the formed primer resin layer, so it is not so preferable.

<Primer Resin Composition Including a Silane Coupling Agent Solution>

Next, a primer resin composition including a silane coupling agent solution will be described. As organic solvents used in a primer resin composition including a silane coupling agent solution, those described in the section for the primer resin composition solution can be used.

The mixing ratio of primer resin composition including a silane coupling agent and the organic solvent in the primer resin composition including a silane coupling agent solution is similar with the mixing ratio of the primer resin composition and the organic solvent in the primer resin composition solution.

Carrying out the processes as described above, the primer resin layer is formed onto a surface of the plated Ni—Zn alloy layer, and electrodeposited copper foil with carrier foil with a primer resin layer of the present invention is manufactured. Here, as required, a process of chromate treatment to form a chromate layer onto a surface of the plated Ni—Zn alloy layer may be carried out within the plated Ni—Zn alloy layer forming process and the primer resin layer forming process. For a method of the chromate treatment, popular methods can be employed.

In the present invention, a silane coupling agent treatment process to form a silane coupling agent layer on top of the plated Ni—Zn alloy layer or the chromate layer may be carried out as required. As the silane coupling agent used in the present step, the same one as the silane coupling agent described with respect to the electrodeposited copper foil with carrier foil with a primer resin layer of the present invention can be used. As the method of the silane coupling agent treatment, conventional methods, for example, applying appropriately diluted silane coupling agent, followed by drying can be employed.

The electrodeposited copper foil with carrier foil with a primer resin layer of the present invention and a method of manufacturing it can be used, for example, for electrodeposited copper foil with carrier foil with a primer resin layer for application as materials for forming electrodes and circuits and manufacture of it.

Examples will be shown as follows but the present invention should not be considered to be limited thereto.

Example 1

Production of Electrodeposited Copper Foil with Carrier Foil

As carrier foil, a copper foil with a thickness of 35 μm (roughness of matte side $R_{zjis}$ being 4.0 μm and roughness of shiny side $R_{zjis}$ being 1.4 μm) rolled up was used. The carrier foil was continuously unwound and the following processing was carried out.

At first, the carrier foil was immersed into a diluted acid of 100 g/l at 25 deg. C. in an acid pickling bath to carry out acid pickling. After acid pickling was over, the test sample was cleaned with pure water.

Next, the carrier foil was immersed into a carboxybenzotriazole solution of 3.5 g/l for 45 seconds in the bonding interface layer forming bath, followed by rinsing with water to form bonding interface layers with a 20 nm thickness on both sides of the carrier foil. At this point of time, the layer structure of the foil became bonding interface layer/carrier foil/bonding interface layer in this order from the matte side of the carrier foil.

Next, the carrier foil on which bonding interface layers have been formed was immersed into a copper sulfate solution containing $Cu^{2+}$ with concentration of 65 g/l and free $SO_4^{2-}$ with concentration of 80 g/l at a temperature of 50 deg. C., and was electrolyzed at 20 A/dm² with an anode arranged apart in a predetermined gap facing to the shiny side of the carrier foil to form a bulk copper layer with 1 μm thickness on the surface of the bonding interface layer on the shiny side of the carrier foil. At this point of time, layer structure of the foil became bonding interface layer/carrier foil/bonding interface layer/bulk copper layer in this order from the matte side of the carrier foil.

Next, the carrier foil on which the bulk copper layer has been formed was immersed into a Ni—Zn solution (plated Ni—Zn alloy layer solution A). The solution A) is prepared by dissolving potassium pyrophosphate being 100 g/l, Zinc pyrophosphate to adjust Zn ion concentration being 0.5 g/l and nickel sulfate to adjust Ni ion concentration being 4 g/l into pure water at 40 deg. C., and then the Ni—Zn-containing plating bath is adjusted to pH 10 with potassium hydroxide solution. The plated Ni—Zn alloy layer was formed on the surface of the bulk copper layer after electrolyzing at 0.59 A/dm² for 9 seconds with an anode arranged apart by a predetermined gap facing to the shiny side of the carrier foil by using the solution A). At this point of time, layer structure of the foil became bonding interface layer/carrier foil/bonding interface layer/bulk copper layer/plated Ni—Zn alloy layer in this order from the matte side of the carrier foil.

Next, the carrier foil with the plated Ni—Zn alloy layer having been formed was immersed into a chromate treatment solution, that is, chromic oxide $CrO_3$ was dissolved in pure water at 30 deg. C. to be 1 g/l of a chromate treatment bath, and was electrolyzed at 1.7 A/dm² for 7 seconds with an anode arranged apart in a predetermined gap facing to the shiny side of the carrier foil to form a chromate layer with Cr deposition being 1.7 mg/m² on the surface of the plated Ni—Zn alloy layer. At this point of time, layer structure of the foil became bonding interface layer/carrier foil/bonding interface layer/bulk copper layer/plated Ni—Zn alloy layer/chromate layer in this order from the matte side of the carrier foil.

Next, in a silane coupling agent treatment bath, a silane coupling agent solution prepared to be 5 g/l of epoxy silane (KBM403, produced by Shin-Etsu Chemical Co., Ltd.) was applied by spraying from the bottom to the chromate layer surface by using a shower nozzle, followed by drying with a heater to form a silane coupling agent layer, and then rolled up. The electrodeposited copper foil with carrier foil (electrodeposited copper foil with carrier foil A) with layer structure of the foil being bonding interface layer/carrier foil/bonding interface layer/bulk copper layer/plated Ni—Zn alloy layer/chromate layer/silane coupling agent layer in this order from the matte side of the carrier foil was obtained through above described steps.

Production of Electrodeposited Copper Foil with Carrier Foil with a Primer Resin Layer <Preparation of Primer Resin Composition>

At first, a primer resin composition (primer resin composition A) was prepared by mixing bisphenol A type epoxy resin (Epikote 828 produced by Japan Epoxy Resins Co., Ltd.) with 40 parts by weight, polyether sulfone resin (SUMI-KAEXCEL 5003P, produced by Sumitomo Chemical Co., Ltd.) with 60 parts by weight and imidazole (2E4MZ, produced by Shikoku Chemicals Corporation) with 1 parts by weight as an epoxy resin curing accelerator. The content of sulfur in the primer resin composition A was 8.2% by weight. Then, a solution containing a solid resin content of 30% by weight (primer resin composition solution A) was prepared by mixing the primer resin composition A and dimethylacetamide.

<Forming of Primer Resin Layer>

Next, the electrodeposited copper foil with carrier foil A was set into a coating machine and was unwound continuously, and the above described primer resin composition solution A was coated on the surface of the silane coupling agent layer of the electrodeposited copper foil with carrier foil A with a coating amount being adjusted by using a gravure coater to form primer resin layer with thickness of 2 μm, followed by drying to semi-cure the primer resin layer. As such, electrodeposited copper foil with carrier foil with a primer resin layer (primer resin coated electrodeposited copper foil with carrier foil A) with layer structure being bonding interface layer/carrier foil/bonding interface layer/bulk copper layer/plated Ni—Zn alloy layer/chromate layer/silane coupling agent layer/primer resin layer in this order from the matte side of the carrier foil was obtained.

The bulk copper layer of the primer resin coated electrodeposited copper foil with carrier foil A is too thin to perform measurement of peel strength as it is. Therefore, as substitute properties, measurements as described below were used for peel strength as received state as well as peel strength after chemical treatment. In addition, roughness in $R_{zjis}$ (μm) was measured after removing the primer resin layer and silane coupling agent layer to expose the chromate layer on the primer resin coated electrodeposited copper foil with carrier foil A. In addition, deposit amount of Ni and Zn in the plated Ni—Zn alloy layer of the primer resin coated electrodeposited copper foil with carrier foil A was analyzed by using ICP optical emission spectrometry. Results thereof are shown in Table 2 and Table 3.

Method of Measuring Peel Strength as Received State and Peel Strength After Chemical Immersion Preparation of Test Specimen for Peel Strength The primer resin coated electrodeposited copper foil with carrier foil A and an epoxy resin impregnated glass cloth base prepreg (FR-4 R1661 produced by Matsushita Electric Works, Ltd.) were lay-up such that the primer resin layer faces the prepreg, and hot pressed at 190 deg. C. for 60 minutes to obtain a copper-clad laminate with a carrier foil (a copper-clad laminate with a carrier foil A). Then the resin substrate layer is obtained by curing the layer structure of the foil. The complete structure being bonding interface layer/carrier foil/bonding interface layer/bulk copper layer/plated Ni—Zn alloy layer/chromate layer/silane coupling agent layer/primer resin layer/prepreg in this order from the matte side of the carrier foil.

After releasing the carrier foil from the copper-clad laminate with a carrier foil A, whereby the bonding interface layer remained on the bulk copper layer surface, and was removed by pickling with diluted hydrochloric acid, a copper-clad laminate (copper-clad laminate A) with the layer structure of bulk copper layer/plated Ni—Zn alloy layer/chromate layer/silane coupling agent layer/primer resin layer/resin substrate layer in the order in view from the side where the carrier foil was obtained.

The copper-clad laminate A is immersed into a copper sulfate solution containing $Cu^{2+}$ with concentration of 65 g/l and free $SO_4^{2-}$ with concentration of 90 g/l at a temperature of 50 deg. C. And electrolysis at 20 A/dm² was carried out with an anode arranged apart in a predetermined gap facing to the bulk copper layer to carry out copper plating on the surface of the bulk copper layer. Thus a thickened copper-clad laminate with bulk copper layer thickened to 35 μm was obtained (thickened copper-clad laminate A).

The thickened copper-clad laminate A was etched to form a plurality of circuits with 0.8 mm width of the thickened bulk copper layer, and thus a printed wiring board was obtained (printed wiring board A). Next, the printed wiring board A is cut to individual circuit boards having one circuit pattern, and plurality of test specimens (peel strength measurement test specimen A) for peel strength measurement having rectangular-shaped circuit with 0.8 mm line width 100 mm length were obtained.

Method of Measuring Peel Strength as Received

A portion around several millimeters from an end of the above described peel strength measurement test specimen A in its longitudinal direction was folded to break just the base along the direction approximately perpendicular to the longitudinal direction of the rectangular-shaped circuit to remain rectangular-shaped circuit. Then a peel strength measurement test specimen A with the rectangular-shaped circuit which is connected at the cut base portion was obtained.

Next, the peel strength measurement test specimen A was set on a peel strength measuring equipment. Then a rectangular-shaped circuit of the portion where the above described base was cut is directed upward and was chucked to the above described peel strength measuring equipment. Next, the chuck was pulled up at a constant speed with peeling off the rectangular-shaped circuit from the resin substrate layer of the peel strength measurement test specimen A. Peel strength was measured according to JIS C-6481 to examine peel strength.

Method of Measuring Peel Strength after Chemical-Immersion

The above described peel strength measurement test specimens A were immersed into a solution with potassium permanganate of 55 g/l at 70 deg. C. with pH 13 for 10 minutes. Picking out them followed by rinsing with pure water, drying by leaving, and pluralities of peel strength after chemical-treatment measurement test specimen (peel strength after chemical-treatment measurement test specimen A) were obtained. Peel strength was measured on peel strength after chemical-treatment measurement test specimen A as shown in the method of measuring peel strength as received, and the value at that time is shown as peel strength after chemical-treatment. As a result, peel strength as received was 1.6 kgf/cm and peel loss after chemical-treatment was around 6%, so it is both acceptable.

Example 2

The electrodeposited copper foil with carrier foil (electrodeposited copper foil with carrier foil B) was obtained as same with Embodiment 1 except electrolysis condition in Ni—Zn plating changed to 0.66 A/dm$^2$ with plating time for 6 seconds having been taken. In analysis on the deposited elements, deposited amount of Ni/Zn/Cr were 4.8/16.2/1.7 mg/m$^2$ for each respectively and Ni/Zn ratio was 3.4.

The electrodeposited copper foil with carrier foil with a primer resin layer (primer resin coated electrodeposited copper foil with carrier foil B) was obtained as same with Embodiment 1. And respective properties were measured on the primer resin coated electrodeposited copper foil with carrier foil B. As a result, P/S after chemical-treatment was 1.7 kgf/cm and peel loss after chemical-treatment was around 6%, so it was acceptable.

Example 3

The electrodeposited copper foil with carrier foil (electrodeposited copper foil with carrier foil C) was obtained as same with Embodiment 1 except electrolysis condition in Ni—Zn plating changed to 0.66 A/dm$^2$ with plating time for 7 seconds have been taken. In analysis on the deposited elements, deposited amount of Ni/Zn/Cr were 6.6/21.2/1.7 mg/m$^2$ for each respectively and Ni/Zn ratio was 3.2.

The electrodeposited copper foil with carrier foil with a primer resin layer (primer resin coated electrodeposited copper foil with carrier foil C) was obtained as same with Embodiment 1. And respective properties were measured on the primer resin coated electrodeposited copper foil with carrier foil C. As a result, P/S after chemical-treatment was 1.6 kgf/cm and peel loss after chemical-treatment was around 6%, so it was acceptable.

Example 4

The electrodeposited copper foil with carrier foil (electrodeposited copper foil with carrier foil D) was obtained as same with Embodiment 1 except electrolysis condition in Ni—Zn plating changed to 0.72 A/dm$^2$ with plating time for 6 seconds having been taken. In analysis on the deposited elements, deposited amount of Ni/Zn/Cr were 5.6/18.8/1.7 mg/m$^2$ for each respectively and Ni/Zn ratio was 3.4.

The electrodeposited copper foil with carrier foil with a primer resin layer (primer resin coated electrodeposited copper foil with carrier foil D) was obtained as same with Embodiment 1. And respective properties were measured on the primer resin coated electrodeposited copper foil with carrier foil D. As a result, P/S after chemical-treatment was 1.6 kgf/cm and peel loss after chemical-treatment was around 6%, so it was acceptable.

Example 5

The electrodeposited copper foil with carrier foil (electrodeposited copper foil with carrier foil E) was obtained as same with Embodiment 1 except electrolysis condition in Ni—Zn plating changed to 0.79 A/dm$^2$ with plating time for 7 seconds having been taken. In analysis on the deposited elements, deposited amount of Ni/Zn/Cr were 12.4/33.6/1.7 mg/m$^2$ for each respectively and Ni/Zn ratio was 2.7.

The electrodeposited copper foil with carrier foil with a primer resin layer (primer resin coated electrodeposited copper foil with carrier foil E) was obtained as same with Embodiment 1. And respective properties were measured on the primer resin coated electrodeposited copper foil with carrier foil E. As a result, P/S after chemical-treatment was 1.6 kgf/cm and peel loss after chemical-treatment was around 6%, so it was acceptable.

Comparative Example 1

In place of the Ni—Zn-containing plating solution A in Embodiment 1, the Ni—Zn solution (Ni—Zn-containing plating solution B) prepared by dissolving potassium pyrophosphate being 100 g/l, zinc pyrophosphate to adjust. Zn ion concentration being 0.95 g/l and nickel sulfate to adjust Ni ion concentration being 1.6 g/l at 40 deg. C. into pure water, and then the Ni—Zn-containing plating bath is adjusted to pH 10 with potassium hydroxide solution. Then electrodeposited copper foil with carrier foil was obtained as same with Embodiment 1 except using the Ni—Zn-containing plating solution B and current density 0.79 A/dm$^2$ have been taken. In analysis of the deposited elements, deposited amount of Ni/Zn/Cr were 10.4/13.6/1.8 mg/m$^2$ for each respectively and Ni/Zn ratio was 1.3.

The electrodeposited copper foil with carrier foil with a primer resin layer (primer resin coated electrodeposited copper foil with carrier foil F) was obtained as same with Embodiment 1. And respective properties were measured on the primer resin coated electrodeposited copper foil with carrier foil F. As a result, P/S after chemical-treatment was 0.85 kgf/cm and peel loss after chemical-treatment was around 50%.

Comparative Example 2

The electrodeposited copper foil with carrier foil was obtained as same with Embodiment 1 except using the Ni—Zn-containing plating solution B and electrolysis condition in Ni—Zn plating changed to 0.79 A/dm² with plating time for 9 seconds have been taken. In analysis on the deposited elements, deposited amount of Ni/Zn/Cr were 14.2/17.8/1.8 mg/m² for each respectively and Ni/Zn ratio was 1.3.

The electrodeposited copper foil with carrier foil with a primer resin layer (primer resin coated electrodeposited copper foil with carrier foil G) was obtained as same with Embodiment 1. And respective properties were measured on the primer resin coated electrodeposited copper foil with carrier foil G. As a result, P/S after chemical-treatment was 0.85 kgf/cm and peel loss after chemical-treatment was around 50%.

Comparative Example 3

The electrodeposited copper foil with carrier foil was obtained as same with Embodiment 1 except t using the Ni—Zn-containing plating solution B and electrolysis condition in Ni—Zn plating changed to 1.05 A/dm² with plating time for 9 seconds have been taken. In analysis on the deposited elements, deposited amount of Ni/Zn/Cr were 16.4/20.2/1.8 mg/m² for each respectively and Ni/Zn ratio was 1.2.

The electrodeposited copper foil with carrier foil with a primer resin layer (primer resin coated electrodeposited copper foil with carrier foil H) was obtained as same with Embodiment 1. And respective properties were measured on the primer resin coated electrodeposited copper foil with carrier foil H. As a result, P/S after chemical-treatment was 0.85 kgf/cm and peel loss after chemical-treatment was around 50%.

Comparative Example 4

The electrodeposited copper foil with carrier foil was obtained as same with Embodiment 1 except t using the Ni—Zn-containing plating solution B and electrolysis condition in Ni—Zn plating changed to 1.18 A/dm² with plating time for 9 seconds have been taken. In analysis on the deposited elements, deposited amount of Ni/Zn/Cr were 20.2/23.8/1.8 mg/m² for each respectively and Ni/Zn ratio was 1.2.

The electrodeposited copper foil with carrier foil with a primer resin layer (primer resin coated electrodeposited copper foil with carrier foil I) was obtained as same with Embodiment 1. And respective properties were measured on the primer resin coated electrodeposited copper foil with carrier foil I. As a result, P/S after chemical-treatment was 0.85 kgf/cm and peel loss after chemical-treatment was around 50%.

Process conditions and results in measurements for Example 1 to Example 5 and Comparative Example 1 to Comparative Example 4 are summarized in Table 1 to Table 3.

TABLE 1

| | Zn concentration in Ni—Zn-containing plating solution (g/l) | Ni concentration in Ni—Zn-containing plating solution (g/l) | Type of Ni—Zn-containing plating solution (g/l) | Current density for electrolysis in Ni—Zn-containing plating solution (A/dm²) | Electrolysis time for electrolysis in Ni—Zn-containing plating solution (second) | Electric charge for electrolysis in Ni—Zn-containing plating solution (C/dm²) |
|---|---|---|---|---|---|---|
| Example 1 | 0.5 | 4.0 | A | 0.59 | 9 | 5.31 |
| Example 2 | 0.5 | 4.0 | A | 0.66 | 6 | 3.96 |
| Example 3 | 0.5 | 4.0 | A | 0.66 | 7 | 4.62 |
| Example 4 | 0.5 | 4.0 | A | 0.72 | 6 | 4.32 |
| Example 5 | 0.5 | 4.0 | A | 0.79 | 9 | 7.11 |
| Comparative Example 1 | 0.95 | 1.6 | B | 0.79 | 9 | 7.11 |
| Comparative Example 2 | 0.95 | 1.6 | B | 0.92 | 9 | 8.28 |
| Comparative Example 3 | 0.95 | 1.6 | B | 1.05 | 9 | 9.45 |
| Comparative Example 4 | 0.95 | 1.6 | B | 1.18 | 9 | 10.62 |

TABLE 2

| | Zn deposit of plated Ni—Zn alloy layer (mg/m²) | Ni deposit of plated Ni—Zn alloy layer (mg/m²) | Zn and Ni deposits of plated Ni—Zn alloy layer (mg/m²) | deposit amount ratio of [Ni weight/Zn weight] | Cr deposit of chromate treatment layer (mg/m²) |
|---|---|---|---|---|---|
| Example 1 | 9.2 | 24.8 | 34.0 | 2.7 | 1.7 |
| Example 2 | 4.8 | 16.2 | 21.0 | 3.4 | 1.7 |
| Example 3 | 6.6 | 21.2 | 27.8 | 3.2 | 1.7 |
| Example 4 | 5.6 | 18.8 | 24.4 | 3.4 | 1.7 |
| Example 5 | 12.4 | 33.6 | 46.0 | 2.7 | 1.7 |
| Comparative Example 1 | 10.4 | 13.6 | 24.0 | 1.3 | 1.8 |
| Comparative Example 2 | 14.2 | 17.8 | 32.0 | 1.3 | 1.8 |
| Comparative Example 3 | 16.4 | 20.2 | 36.6 | 1.2 | 1.8 |
| Comparative Example 4 | 20.2 | 23.8 | 44.0 | 1.2 | 1.8 |

TABLE 3

| | Roughness $R_{zjis}$ of chromate layer surface (mm) | peel strength as received (kgf/cm) | Peel Strength after Chemical-treatment (kgf/cm) |
|---|---|---|---|
| Example 1 | 1.4 | 1.7 | 1.6 |
| Example 2 | 1.4 | 1.7 | 1.6 |
| Example 3 | 1.4 | 1.7 | 1.6 |
| Example 4 | 1.4 | 1.7 | 1.7 |
| Example 5 | 1.4 | 1.7 | 1.6 |
| Comparative Example 1 | 1.4 | 1.7 | 0.85 |
| Comparative Example 2 | 1.4 | 1.7 | 0.85 |
| Comparative Example 3 | 1.4 | 1.7 | 0.85 |
| Comparative Example 4 | 1.4 | 1.7 | 0.85 |

According to Table 1 to Table 3, it is apparent that a smaller Ni/Zn deposit amount ratio in plated Ni—Zn alloy layer causes peel loss after chemical-treatment in comparison to the peel strength as received.

INDUSTRIAL APPLICABILITY

The electrodeposited copper foil with carrier foil of the present invention and a method of manufacturing thereof can be applied, for example, to electrodeposited copper foil with carrier foil as materials for forming electrodes and circuits and to manufacture the electrodeposited copper foil with carrier foil.

The invention claimed is:

1. An electrodeposited copper foil with carrier foil with a primer resin layer, comprising a bonding interface layer, an unroughened bulk copper layer, a rust proofing layer and the primer resin layer which are formed in the recited order on a surface of at least one side of the carrier foil,
wherein a) the rust proofing layer comprises a plated Ni—Zn alloy layer and a roughness $R_{zjis}$ measured on a surface of said plated Ni—Zn alloy layer is not more than 3 μm, b) said plated Ni—Zn alloy layer comprises at least Ni and Zn having a Ni/Zn deposit amount ratio of 1.5 to 10, c) a surface roughness $R_{zjis}$ of a deposition side surface of the bulk copper layer is not more than 3 μm, and d) the primer resin layer is a semi-cured primer resin composition which comprises an epoxy resin and a polyether sulfone, the polyether sulfone having at its ends functional groups selected from a hydroxyl group and/or an amino group, the primer resin layer has an equivalent thickness of 1 μm to 5 μm, and the primer resin layer is a layer that is bonded to a resin substrate layer.

2. The electrodeposited copper foil with carrier foil with a primer resin layer according to claim 1, wherein said rust proofing layer comprises a silane coupling agent layer on the surface thereof.

3. The electrodeposited copper foil with carrier foil with a primer resin layer according to claim 1,
wherein the primer resin composition comprises the epoxy resin in an amount of 5% by weight to 50% by weight and the polyether sulfone resin in an amount of 95% by weight to 50% by weight, based on 100% by weight of the epoxy resin and the polyether sulfone.

4. The electrodeposited copper foil with carrier foil with a primer resin layer according to claim 1,
wherein the primer resin composition further contains an epoxy resin curing agent.

5. The electrodeposited copper foil with carrier foil with a primer resin layer according to claim 4,
wherein the primer resin composition comprises a sum of the epoxy resin and the epoxy resin curing agent in an amount of 5% by weight to 50% by weight, and the polyether sulfone resin in an amount of 95% by weight to 50% by weight, based on 100% by weight of the epoxy resin, the epoxy curing agent and the polyether sulfone.

6. The electrodeposited copper foil with carrier foil with a primer resin layer according to claim 1,
wherein the epoxy resin has a structure shown in following formula

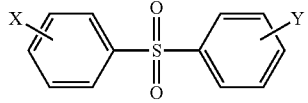

in which X and Y are

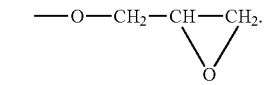

7. The electrodeposited copper foil with carrier foil with a primer resin layer according to claim 4,
wherein the epoxy resin curing agent has a structure shown in following formula

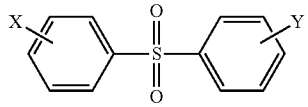

in which X and Y are —OH or —NH$_2$, and in which X and Y may be the same or different.

8. The electrodeposited copper foil with carrier foil with a primer resin layer according to claim 1,
wherein the primer resin composition further comprises a silane coupling agent.

9. The electrodeposited copper foil with carrier foil with a primer resin layer according to claim 8,
wherein the silane coupling agent is present in an amount of 0.1 parts by weight to 5 parts by weight based on 100 parts by weight of the primer resin composition.

10. The electrodeposited copper foil with carrier foil with a primer resin layer according to claim 1,
wherein the primer resin layer comprises a sulfur content of 0.6% by weight or more.

11. The electrodeposited copper foil with carrier foil with a primer resin layer according to claim 1,
wherein an amount of Ni in the plated Ni—Zn alloy layer is in a range of 1 mg/m$^2$ to 50 mg/m$^2$.

12. The electrodeposited copper foil with carrier foil with a primer resin layer according to claim 1,
wherein the carrier foil is a copper foil.

13. An electrodeposited copper foil with carrier foil with a primer resin layer according to claim 1, wherein the rust proofing layer comprises a chromate layer formed on the plated Ni—Zn alloy layer.

14. An electrodeposited copper foil with carrier foil with a primer resin layer, comprising a bonding interface layer, an unroughened bulk copper layer, a rust proofing layer and the primer resin layer which are formed in the recited order on a surface of at least one side of the carrier foil,
wherein a) the rust proofing layer comprises a plated Ni—Zn alloy layer and a roughness $R_{zjis}$ measured on a surface of said plated Ni—Zn alloy layer is not more than 3 μm, b) said plated Ni—Zn alloy layer comprises at least Ni and Zn having a Ni/Zn deposit amount ratio of 1.5 to 10, c) a surface roughness $R_{zjis}$ of a deposition side surface of the bulk copper layer is not more than 3 μm, and d) the primer resin layer has an equivalent thickness of 1 μm to 5 μm and is a semi-cured primer resin composition comprising an epoxy resin curing agent and an epoxy resin, the epoxy resin having a structure shown in the following formula

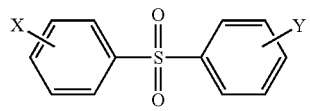

in which X and Y are

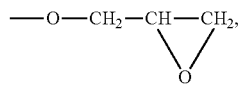

and the primer resin layer is a layer that is bonded to a resin substrate layer.

15. The electrodeposited copper foil with carrier foil with a primer resin layer according to claim 8,
wherein the primer resin layer is a semi-cured primer resin composition further comprising a polyether sulfone having functional groups at its ends selected from a hydroxyl group and/or an amino group.

16. An electrodeposited copper foil with carrier foil with a primer resin layer according to claim 14, wherein the rust proofing layer comprises a chromate layer formed on the plated Ni—Zn alloy layer.

17. An electrodeposited copper foil with carrier foil with a primer resin layer, comprising a bonding interface layer, an unroughened bulk copper layer, a rust proofing layer and the primer resin layer which are formed in the recited order on a surface of at least one side of the carrier foil,
wherein a) the rust proofing layer comprises a plated Ni—Zn alloy layer and a roughness $R_{zjis}$ measured on a surface of said plated Ni—Zn alloy layer is not more than 3 μm, b) said plated Ni—Zn alloy layer comprises at least Ni and Zn having a Ni/Zn deposit amount ratio of 1.5 to 10, c) a surface roughness $R_{zjis}$ of a deposition side surface of the bulk copper layer is not more than 3 μm, and d) the primer resin layer has an equivalent thickness of 1 μm to 5 μm and is a semi-cured primer resin composition comprising an epoxy resin and an epoxy resin curing agent, the epoxy resin curing agent having a structure shown in the following formula

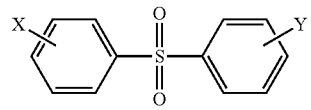

in which X and Y are —OH or —NH$_2$, and in which X and Y may be the same or different, and the primer resin layer is a layer that is bonded to a resin substrate layer.

18. An electrodeposited copper foil with carrier foil with a primer resin layer according to claim 17, wherein the rust proofing layer comprises a chromate layer formed on the plated Ni—Zn alloy layer.

19. A method of manufacturing the electrodeposited copper foil with carrier foil with a primer resin layer according to claim 1 comprising, in the order recited:
a) contacting a carrier foil with bonding interface forming agents;
b) fixing the bonding interface forming agents on the carrier foil to form a bonding interface layer;
c) performing an electrolysis using a bulk copper plating solution to form a bulk copper layer on the bonding interface layer;
e) forming a rust proofing layer on a surface of the bulk copper layer, wherein the rust proofing layer comprises a Ni—Zn alloy layer or a binary construction of a Ni—Zn plated layer and a chromate layer, by using a plating solution comprising at least Ni and Zn and a chromate treatment solution; and
f) forming the primer resin layer by coating a primer resin composition which may optionally comprise a silane coupling agent on a surface of the rust proofing layer.

20. The method of manufacturing an electrodeposited copper foil with carrier foil with a primer resin layer according to claim 19,
wherein the Ni—Zn containing plating solution has a concentration ratio of Ni ion concentration to Zn ion concentration (Ni/Zn) within 1.5 to 27.

* * * * *